United States Patent
Brunner et al.

(10) Patent No.: US 7,378,738 B2
(45) Date of Patent: May 27, 2008

(54) METHOD FOR PRODUCING SELF-ALIGNED MASK, ARTICLES PRODUCED BY SAME AND COMPOSITION FOR SAME

(75) Inventors: Timothy A. Brunner, Ridgefield, CT (US); Matthew E. Colburn, Hopewell Junction, NY (US); Elbert Huang, Tarrytown, NY (US); Muthumanickam Sankarapandian, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/653,476

(22) Filed: Sep. 2, 2003

(65) Prior Publication Data

US 2005/0045997 A1 Mar. 3, 2005

(51) Int. Cl.
*H01L 23/48* (2006.01)
*H01L 23/52* (2006.01)
*H01L 29/40* (2006.01)

(52) U.S. Cl. ............... 257/758; 257/759; 257/E21.232; 257/E21.035

(58) Field of Classification Search ................ 257/751, 257/752, 758–760, 762–765, E21.232, E21.035
See application file for complete search history.

(56) References Cited

U.S. PATENT DOCUMENTS

| 6,448,655 | B1 * | 9/2002 | Babich et al. | 257/759 |
| 6,583,043 | B2 * | 6/2003 | Shroff et al. | 438/618 |
| 6,777,807 | B1 * | 8/2004 | Lu et al. | 257/751 |
| 2002/0187625 | A1 * | 12/2002 | Shimooka et al. | 438/618 |

* cited by examiner

*Primary Examiner*—Thien F Tran
(74) *Attorney, Agent, or Firm*—Scully, Scott, Murphy & Presser, P.C.; Daniel P. Morris, Esq.

(57) ABSTRACT

A method for forming a self-aligned pattern on an existing pattern on a substrate comprising applying a coating of a solution containing a masking material in a carrier, the masking material being either photo or thermally sensitive; performing a blanket exposure of the substrate; and allowing at least a portion of the masking material to preferential develop in a fashion that is replicates the existing pattern of the substrate. The existing pattern may be comprised of a first set of regions of the substrate having a first reflectivity and a second set of regions of the substrate having a second reflectivity different from the first composition. The first set of regions may include one or more metal elements and the second set of regions may include a dielectric. Structures made in accordance with the method.

10 Claims, 7 Drawing Sheets

METHOD FOR PRODUCING SELF-ALIGNED MASK, ARTICLES PRODUCED BY SAME AND COMPOSITION FOR SAME

FIELD OF THE INVENTION

The present invention relates to the production of patterns on a substrate having regions with different optical properties, i.e., reflectivity, absorbance or transparency. More particularly, the present invention relates to a method of producing fine patterns on substrates used in, for example, the microelectronics industry on which electronic devices are fabricated. The present invention also relates to devices fabricated in accordance with the inventive method. The patterns are fabricated accurately and inexpensively without the use of typical lithography steps that include overlay of a mask pattern to a pre-patterned substrate. The present invention also provides many additional advantages, which shall become apparent as described below.

BACKGROUND OF THE INVENTION

A number of applications and technologies involve structures having a well-defined arrangement of distinct regions. Normally, these structures are defined by patterning processes such as lithography, embossing, and stamping, and have length scales ranging from nanometers to several microns and to even millimeters. In many of these systems, it may be necessary or beneficial to apply an additional component or treatment to, or above, only one of the regions at the surface. One commonly used technique for performing this is through the use of a mask material to protect regions where this additional application or treatment is not desired. Effectively, the mask material directs this treatment to the intended surfaces, which are fully exposed. Unfortunately, typical procedures used to generate a mask by lithographic or other means can be expensive and error prone, particularly when alignment or overlay is required. Thus, techniques for circumventing these conventional approaches would be highly advantageous.

A particular example in which such strategies would be useful involves integrated circuits (ICs) comprised of metal and dielectric components. It is widely known in the semiconductor industry that the speed of propagation of interconnect signals is one of the most important factors controlling overall circuit speed as feature sizes are reduced and the number of devices per unit area is increased. Throughout the semiconductor industry, there has been a strong drive to reduce the dielectric constant, k, of the dielectric materials existing between metal lines and/or to minimize the thickness of layers having comparatively larger dielectric constants, e.g., a cap barrier layer. Both of these approaches reduce the effective dielectric constant, $k_{eff}$, of the components between metal lines and as a result, interconnect signals travel faster through conductors due to a reduction in resistance-capacitance (RC) delays. Unfortunately, these strategies are difficult to implement due to limitations in maintaining sufficient properties, i.e., mechanical, barrier, electrical, etc., that result when there is a reduction in thickness or changes in the chemistry of the layers.

As such, a method of producing fine patterns on a substrate, which overcomes the above-mentioned drawbacks, is needed.

SUMMARY OF THE INVENTION

The present invention relates to a method to fabricate masks onto a pre-patterned substrate having two or more regions of distinct optical properties, such as reflectivity, absorbance or transparency, or two or more composite structures adjacent to one another of distinct reflectivity, absorbance or transparency. A self-aligned mask is produced in a masking material that is sensitive to light or heat. An example of such a masking material is a conventional photoresist. Typical photoresists have a threshold dose required to undergo some type of conversion or switch, for example, a switch in polarity, solubility, reactivity, or stability, and consequently respond to a development procedure. Using the difference in reflectivity, absorbance or transparency of adjacent regions on the substrate, dose variations in the photoresist can be generated that mimic the spatial differences of these optical properties on the substrate. By selecting an appropriate dose, the photoresist can be switched in some regions above the underlying pattern, while remaining unswitched in other regions, as dictated by the differences in reflectivity, absorbance or transparency of the underlying patterned substrate.

Consequently, the pattern generated in the masking material is self-aligned to the substrate upon which it is placed. The method of the present invention can apply to any technology or application involving a heterogeneous substrate including, for example, interconnect structures for high speed microprocessors, application specific integrated circuits (ASICs), memory storage, displays, hi-throughput screening methods, such as a lab on a chip, microfabricated fluidic devices, etc. The utility of the inventive method stems from a simple and robust means in which the replication of a patterned substrate to generate a self-aligned mask can be performed, circumventing the requirement for difficult and error prone methods, such as alignment of a lithography mask relative to pre-patterned substrate.

Thus, the present invention provides an extremely advantageous alternative to the prior art techniques. The present invention provides a means to replicate a pattern on a pre-patterned substrate in such as manner as to act as a mask. For example, the effective dielectric constant of an interconnect structure can be reduced by the use of a process where layers are selectively placed upon a capped interconnect structure and used to remove the high-k dielectric cap between the metal lines. Additionally, in the opposite tone, for which self-alignment is on the dielectric/hard-mask surfaces of an interconnect structure, the resist, can then be used as a mask for subsequent deposition of other layers that serve as diffusion barriers to copper, barriers to oxygen and/or water permeation, layers which reduce the electromigration attributes of the metal lines, and seed layers. By using these processes, the mask can be self-aligned such that overlay processes are not required to define the features. Both tones of masking (i.e., positive and negative) can be beneficial depending on subsequent processing requirements. An additional benefit of the present invention is that neither an expensive lithography mask, nor an expensive lithography system is required. Rather, a simple exposure tool that is able to generate a blanket exposure can be utilized. In some embodiments of the present invention, it may be beneficial to have an exposure system that is monochromatic.

Thus, in the example of integrated circuits, the use of the self-aligned masks allows a unique process in which the effective dielectric constant between metal lines can be reduced through selective application of various materials to the metal lines or as a selective mask for removing high-k dielectric material between the metal lines. The term "high-k dielectric" is used in the present invention to denote an insulator material that has a dielectric constant, k, greater than 3.0 preferably greater than 7.0. This is of great importance in maximizing the propagation speed of interconnect signals and ultimately provides faster overall circuit performance. Furthermore, the present invention leads to a higher level of protection as well as reliability of interconnect structures and reduced processing costs relative to comparable lithographic processes utilizing overlay strategies.

Although, the utilization of the self-aligned masks are described for microelectronic parts, the inventive method is envisioned to be useful for any application whereby the modification of a specific component in a pre-patterned substrate is beneficial, and, in which, the prepatterned substrate has distinct regions of reflectivity absorbance or transparency that are commensurate with the existing pattern on the substrate. While the examples shown are for regions of difference reflectivity, the method and structures generated by the method are equally applicable to systems or substrates with different regions of absorbance or transparency. Blanket exposure may be made from any direction or surface relative to the pre-patterned substrate/masking material. For example, a Si wafer patterned with a metallic pattern can be exposed with infrared (IR) radiation from either surface of the Si wafer. In this case, the IR transmits through the Si wafer and the metallic pattern on the surface generates an intensity map in the masking material self-aligned with the metallic pattern.

Thus, the present invention is directed to a method for forming a self-aligned pattern on an existing pattern on a substrate comprising the steps of: applying a coating of a solution containing a masking material in a carrier (or solvent), the masking material being ion, electron beam, photo or thermally sensitive; exposing the coated masking material to a blanket exposure with sufficient dose to generate a response in the masking material; and allowing at least a portion of the masking material to preferentially develop over portions of the existing pattern in either positive or negative tone.

In general, the masking material may be selected from any photosensitive material and may include functionalized acrylates, functionalized norbornenes, functionalized styrenes, or any other material suitable for a photoresist or thermally sensitive resist. Preferred masking materials include positive tone or negative tone photoresists or positive tone thermal or negative tone thermal photoresists.

The existing pattern on the substrate may be comprised of a first set of regions having a first atomic composition and a second set of regions having a second atomic composition that differs from the first composition. The first set of regions may include one or more conductive elements and the second set of regions may include a dielectric. The pafferned substrate may be comprised of a layered composite film stack that has distinct regions of different reflectivity, absorbance or transparency adjacent to one another. The pattern in the masking material may be generated by removing a portion of the masking material by at least one of rinsing, ultrasonication, dissolution, thermolysis, reactive ion etch, wet chemical etch, and decomposition. In some embodiments, the self-aligned pattern is disposed upon the second set of regions.

In one embodiment, the developed patterned masking material may be exposed to a dry etch process to expose either a first region or a second region on the substrate. In another embodiment, the masking material has a thickness equal to a minima or maxima in a plot of reflectivity versus resist film thickness for one or more of the surfaces of interest. In yet another embodiment of the present invention, the masking material has a thickness that maximizes the difference in the thickness of the masking material in a plot of film thickness versus exposure dose for one or more of the surfaces of interest. In that embodiment of the present invention, the masking material may have a thickness of zero over one or more of the surfaces of interest.

The mask pattern may serve as a lift-off mask, an etch mask or as a sacrificial polish layer.

The masking material is applied to the substrate containing an existing pattern by a method selected from: spin-coating, dip coating, spray coating, and using a doctor blade. The blanket exposure may be performed at a wavelength of less than 2 microns. Alternatively, two distinct wavelengths can be used for which the masking material is sensitive.

Regions of the substrate may comprises copper or aluminum or any other conductive material including conductive polymers and may be patterned electrical interconnects. The substrate may be a silicon wafer containing electronic devices. The substrate comprises, in part or in entirety, Si, $SiO_2$, SiGe, Ge Ga, GaAs, Hg, HgTd, In, InP, Al, or any other semiconducting material that is inorganic or organic in nature.

The inventive structure may comprise at least one conductive feature formed on the substrate, with the substrate further comprising at least one insulating layer surrounding the conductive feature. The at least one insulating layer may surround at least one conductive feature at its bottom and lateral surfaces. The inventive structure may further comprise at least one conductive barrier layer disposed on at least one interface between the insulating layer and the at least one conductive feature. The combination of the at least one conductive feature and the insulating layers may be repeated to form a multilevel interconnect stack.

The inventive structure may be one of a microelectronic device chip, a ceramic chip carrier, a microfluidic chip, or an organic chip carrier.

Other and further objects, advantages and features of the present invention will be understood by reference to the following specification in conjunction with the annexed drawings, wherein like parts have been given like numbers.

BRIEF DESCRIPTION OF THE DRAWINGS OF THE INVENTION

DETAILED DESCRIPTION OF PREFERRED EMBODIMENTS

As stated above, the present invention provides a patterned substrate containing structures having two or more distinct components processed by a route whereby masking layers can be applied to selected component surfaces. These masking layers can be generated by a number of self-assembly approaches described below and can be used as a mask for subsequent treatment or material deposition onto the intended component surfaces. These structures can be sacrificial and, in general, do not remain in the final structure.

The use of masks for the generation of self assembled barrier layers can proceed by a number of different routes including: blanket deposition, followed by lift-off, blanket deposition followed by chemical mechanical polishing (CMP), and enhancement of selective electrochemical and electroless metal deposition processes. It will be clear to one skilled in the art that the application of a self-aligned masking layer by any of the approaches described herein can be used as a process to generate a selective mask.

Figure 1A:
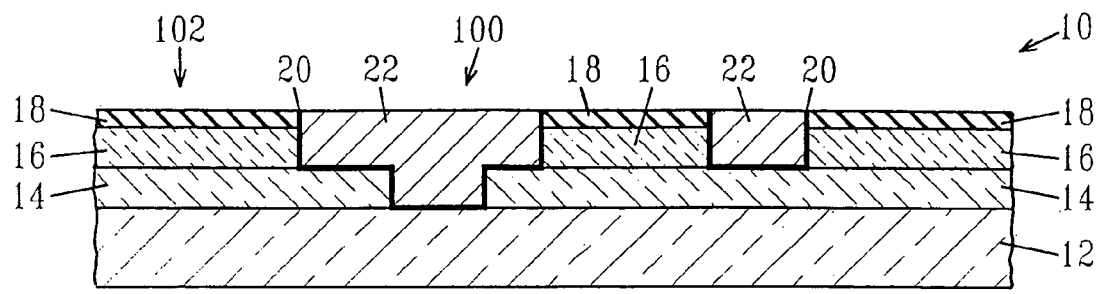
FIGS. 1A-1D are cross-sectional views showing the various processing steps of the present invention that are used in generating a self-aligned mask on an existing, pre-patterned interconnect structure. The method illustrated in FIGS. 1A-1D is a positive tone example.

Reference is first made to the processing scheme outlined in FIGS. 1A-1D in which a self-aligned mask is formed on an existing pattern of a substrate. In the specific example provided in FIGS. 1A-1D, the self-aligned pattern is a capping layer 26 and the existing pattern on the substrate is a conductive line 22 of an interconnect structure 10. FIG. 1A is a representative cross-section of the interconnect structure 10 that can be utilized by the inventive method. Interconnect structure 10 includes a substrate 12, a via-level dielectric 14, a line-level dielectric 16, an optional hardmask 18, a conductive line 22 and a liner material 20. The structure has two distinct regions 100 and 102 with distinct reflectivity. Region 100 refers to the conductive lines 22, while region 102 refers to the exposed surfaces of optional hardmask 18 or the line-level dielectric 16.

The interconnect structure shown in FIG. 1A is made using conventional back-end-of-line (BEOL) techniques well known to those skilled in the field of semiconductor manufacturing. Thus, interconnect structure 10 may be formed utilizing a single or dual damascene process. Substrate 12 of interconnect structure 10 is comprised of any semiconductor material including, for example, Si, SiGe, SiC, SiGeC, GaAs, InAs, InP and other III/V compound semiconductors. Substrate 12 may also be a layered semiconductor substrate such as, for example, a silicon-on-insulator or a SiGe-on-insulator material. The substrate 12 may be of the n- or p-type depending on the type of device contained within or on the substrate.

Via-level dielectric 14 and line-level dielectric 16 of interconnect structure 10 may be comprised of the same or different insulator material. The insulator material may be porous or non-porous. Organic as well as inorganic insulators that have a dielectric constant equal to or lower than $SiO_2$ may be employed. The dielectrics 14 and 16 may be formed by any suitable deposition process including, for example, spin on coating, chemical vapor deposition, plasma-enhanced chemical vapor deposition, evaporation and other like processes. Optionally, there may be a thin layer (not shown) between the via-level dielectric 14 and the line-level dielectric 16 of the interconnect structure 10. This optional layer is often referred to as the etch stop.

Optional hardmask 18 is formed atop the line-level dielectric 16 utilizing a conventional deposition process. The optional hardmask 18 is composed of an oxide, nitride, oxynitride or any combination thereof. The optional hardmask 18 serves as an etch stop layer as well as a protective layer in the interconnect structure 10.

Vias and lines are formed into the dielectric layers 14 and 16 and then a liner material 20, such as TiN, TaN, WN, $Si_xN_yC_z$ or other like diffusion barrier material, is deposited in the lines and vias. Specifically, the liner material 20 is formed in the lines and vias by sputtering, ionized physical vapor deposition (i-PVD), chemical vapor deposition, atomic layer deposition, or another like deposition process. The lines and vias are then filled with a conductive material such as Cu, Al, W, and alloys thereof utilizing a conventional deposition process such as sputtering. The conductive material in the line-level dielectric 16 is referred to in the art as a conductive line, whereas the conductive material in the via-level dielectric is referred to in the art as a conductive via.

Figure 1B:
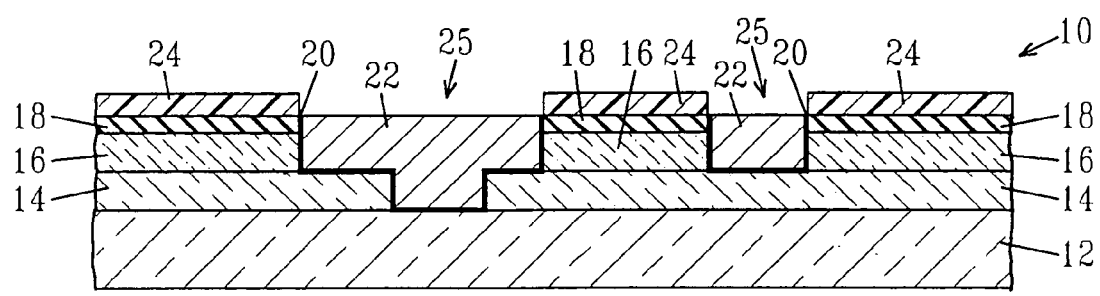

In FIG. 1B, a masking material is applied via a conventional deposition process such as spin on coating over the surface of the structure shown in FIG. 1A and exposed to a suitable light source, such as ultraviolet, infrared or other actinic wavelength(s), such that the delivered dose allows for selective development over the region containing the conductive line 22 and results in the patterned masking layer 24. The patterned masking layer 24 contains opening 25 that expose the lines 22.

Suitable masking materials include one of the materials mentioned in the summary section of this application. Development is achieved by using one of the techniques also described in the summary of the present application.

Figure 1C:
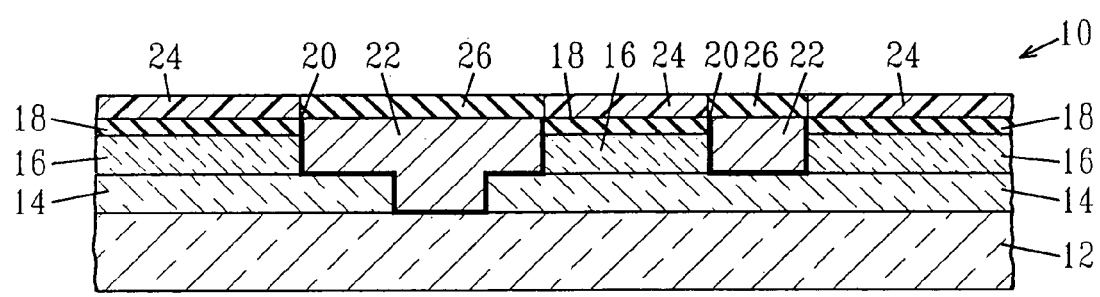

A capping material 26 is formed in the opening 25 over the conductive line 22 providing the structure shown, for example, in FIG. 1C. The capping material 26 may comprise an oxide, nitride, oxynitride or any combination thereof. The capping layer 26 may be formed by a deposition process, such as, for example, chemical vapor deposition, plasma-enhanced chemical vapor deposition, evaporation or another like deposition process. Alternatively, the capping material 26 is formed by a thermal process including, for example, oxidation, nitridation or oxynitridation.

Figure 1D:
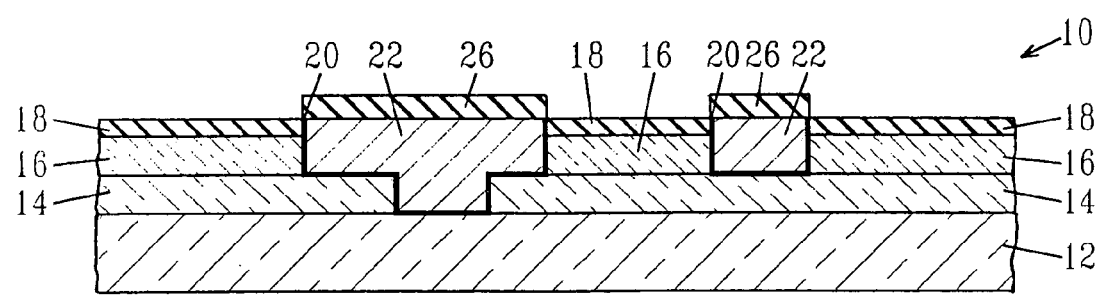

The patterned masking layer 24 is removed from the structure shown in FIG. 1C to provide the structure shown in FIG. 1D. The removal of the patterned masking layer 24 is achieved by utilizing a conventional resist stripping process. As shown in FIG. 1D, the cap material 26 is self-aligned with the existing pattern, i.e. conductive line 22 of the interconnect structure 10.

The above description provides an example in which the masking material is a positive tone resist material; the following description, with reference to FIGS. 2A-D illustrates an embodiment in which a negative tone resist material is employed. This embodiment of the present invention begins with first providing the interconnect structure 10 shown in FIG. 1A.

Next, a masking material film is applied over the surface of the structure shown in FIG. 1A and then the masking material is exposed to a suitable light source, such as an actinic light source, such that the delivered dose allows for selective development of the masking material over region 102. Accordingly, patterned masking layer 24 is formed over the conductive lines 22 in this embodiment of the present invention. The resultant structure including patterned masking layer 24 over conductive lines 22 is shown, for example, in FIG. 2A.

Figure 2A:
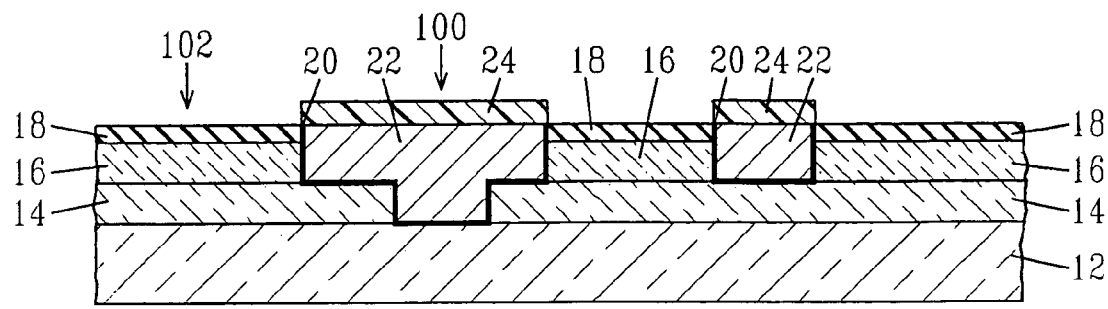
FIGS. 2A-2D are cross-sectional views showing the various processing steps of the present invention that are used in generating a self-aligned mask on an existing pre-patterned interconnect structure. The method illustrated in FIGS. 2A-2D is a negative tone example.
Figure 2B:
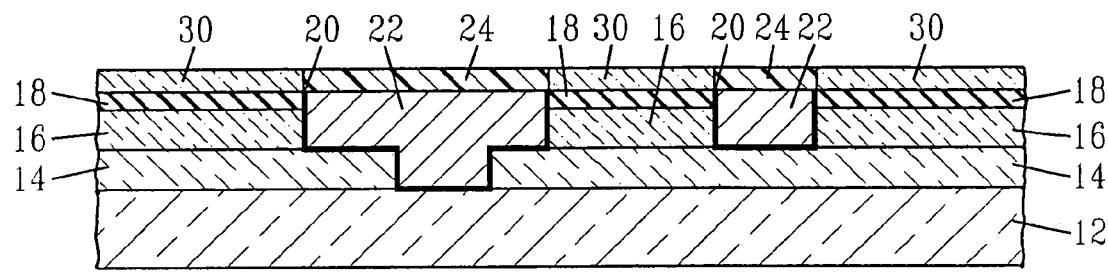

Next, and as shown in FIG. 2B, a sacrificial material 30 is formed over region 102. Specifically, sacrificial material 30 is formed atop the surface of optional hardmask 18 or atop the surface of the line-level dielectric 16. The sacrificial material 30 may be comprised of any material that can be selectively etched as compared with patterned masking layer 24 and capping material 26. Examples of suitable sacrificial materials 30 that can be employed in the present invention include diamond like carbon (DLC), sputtered $SiO_2$, aluminum or any material that can be removed selectively with respect to at least the masking material. The sacrificial material 30 may be formed by a conventional deposition process, or it may be formed by a thermal growth process.

Figure 2C:
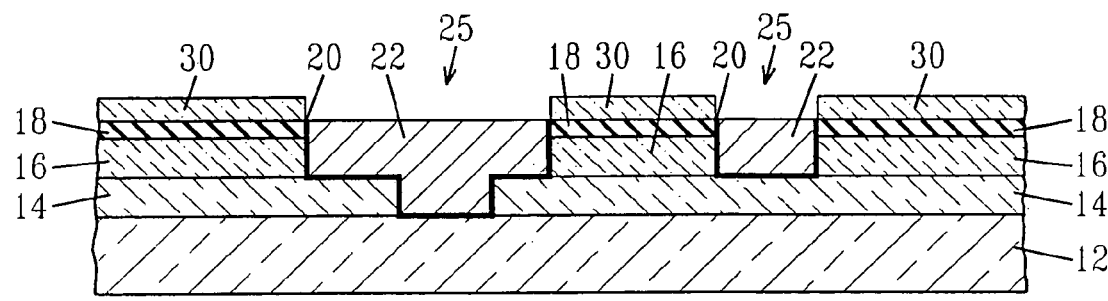
Figure 2D:
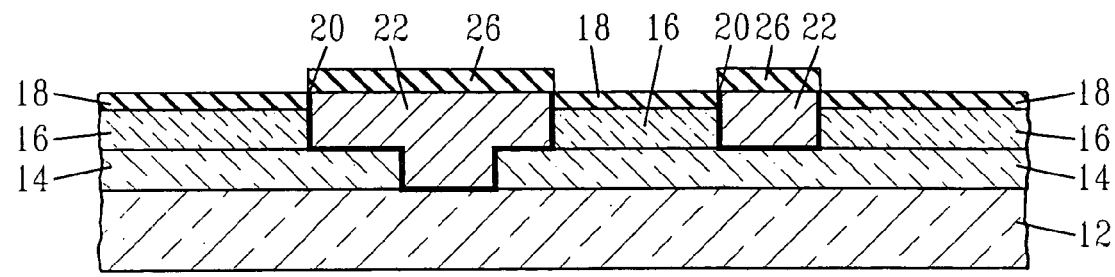

The patterned masking layer 24 is then removed from the structure utilizing a conventional resist stripping process providing the structure shown, for example, in FIG. 2C. The structure shown in FIG. 2C includes opening 25 that expose the surface of conductive line 22.

With the sacrificial material 30 still in place, capping material 26 is formed over the conductive line 22. The sacrificial material 30 is then removed to leave the capping material 26 self-aligned with the existing pattern in the original interconnect structure. This structure is shown, for example, in FIG. 2D.

The above description concerns one example in which the present invention can be used to form a self-aligned mask over pre-existing patterns of an initial substrate. Other examples are possible and are thus contemplated herein. A key concept of the present invention is based on the fact that the difference in reflectivity, absorbance or transparency of adjacent regions on a substrate can be used to generate a dose variation in the masking material that mimic the spatial differences of these optical properties in the substrate.

Figure 3:
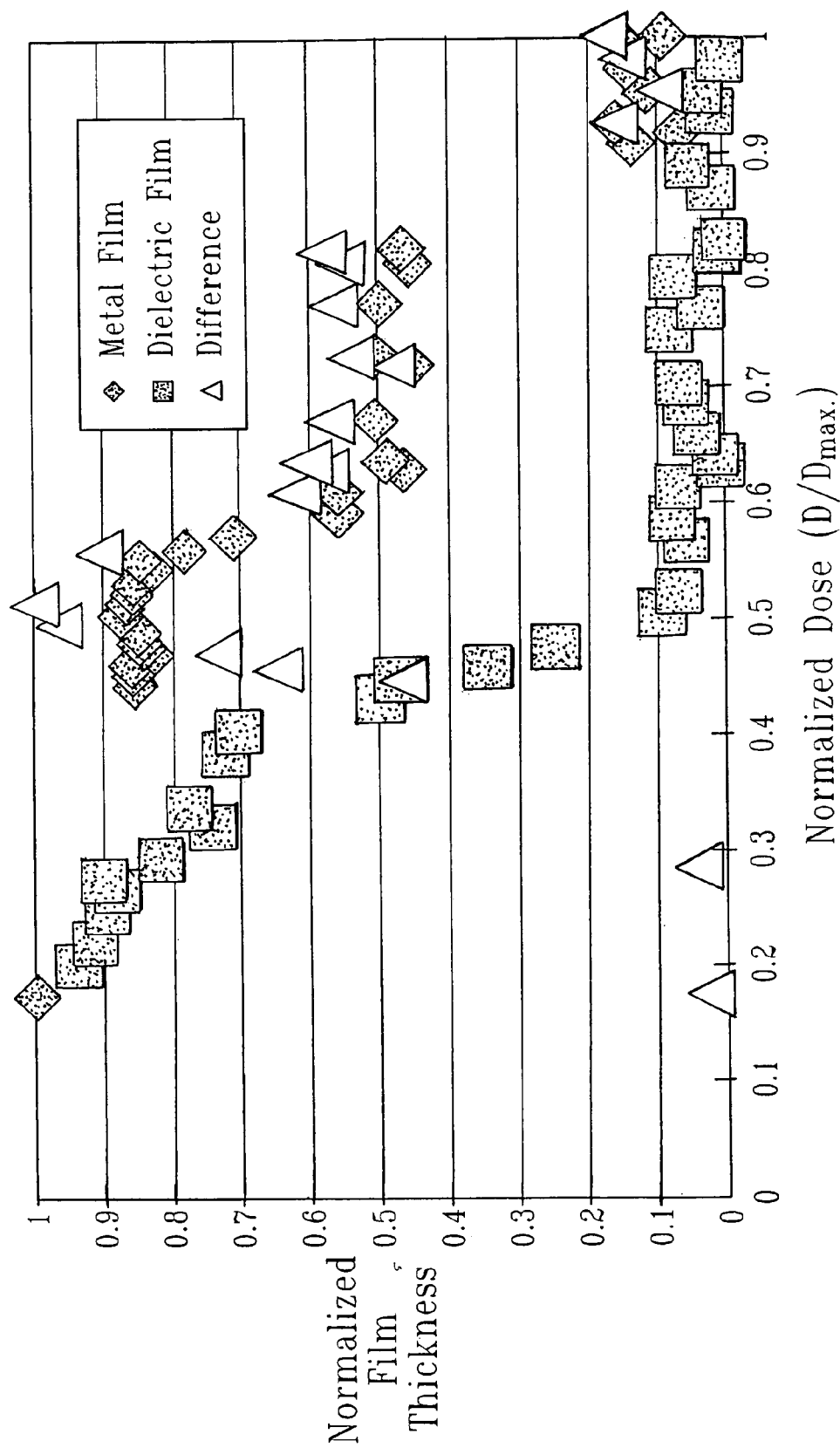
FIG. 3 is a plot of normalized resist thickness as a function of normalized exposure dose for an optimized resist formulation coated on a blanket metallic film, denoted by diamonds, and a blanket dielectric stack, denoted by squares. The difference of the normalized film thickness versus dose is represented by triangles.

FIG. 3, which shows this concept, is a plot of normalized resist thickness ($T/T_0$) as a function of normalized exposure dose ($D/D_{max}$) for an optimized resist formulation coated on a blanket metallic film and a blanket dielectric stack. The blanket films simulate the environment the resist has while over a metallic line and a dielectric stack, respectively. The initial thickness ($T_0$) of both resist films are identical. The dose (D) was normalized approximately relative to the maximum exposure dose ($D_{max}$). The thickness (T) of the resist for a specific normalized dose ($D/D_{max}$) was normalized relative to the initial thickness ($T_0$). The normalized thickness ($T/T_0$) of the resist coated on the conductive film is shown in diamonds. The normalized thickness ($T/T_0$) of the resist coated on the dielectric stack is shown in squares. The difference (triangles) of the normalized film thickness versus dose shows that selective development of the resist film over the dielectric stack as the normalized dose is increased above 0.5 thus indicating an effective dose for generating a self-aligned space over the dielectric film stack.

Figure 4:
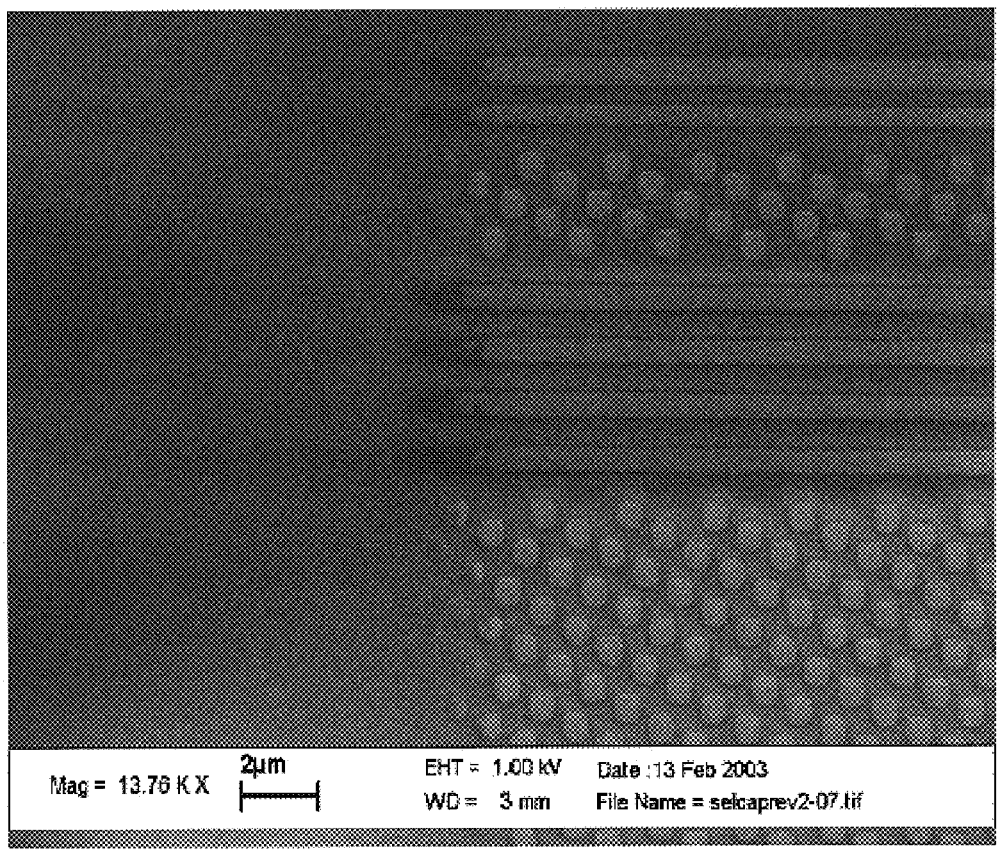
FIG. 4 is a top-down scanning electron image at the edge of an exposure field where the left portion of the masking material is unexposed and the right portion of the masking material is exposed.

FIG. 4 is a top-down scanning electron image at the edge of an exposure field where the left portion of a masking material has received no exposure and the right portion of the masking material is exposed uniformly over the interconnect structure. The lack of topography on the region with no exposure is clear. The topography of the right portion is shown in FIG. 6.

Figure 5:
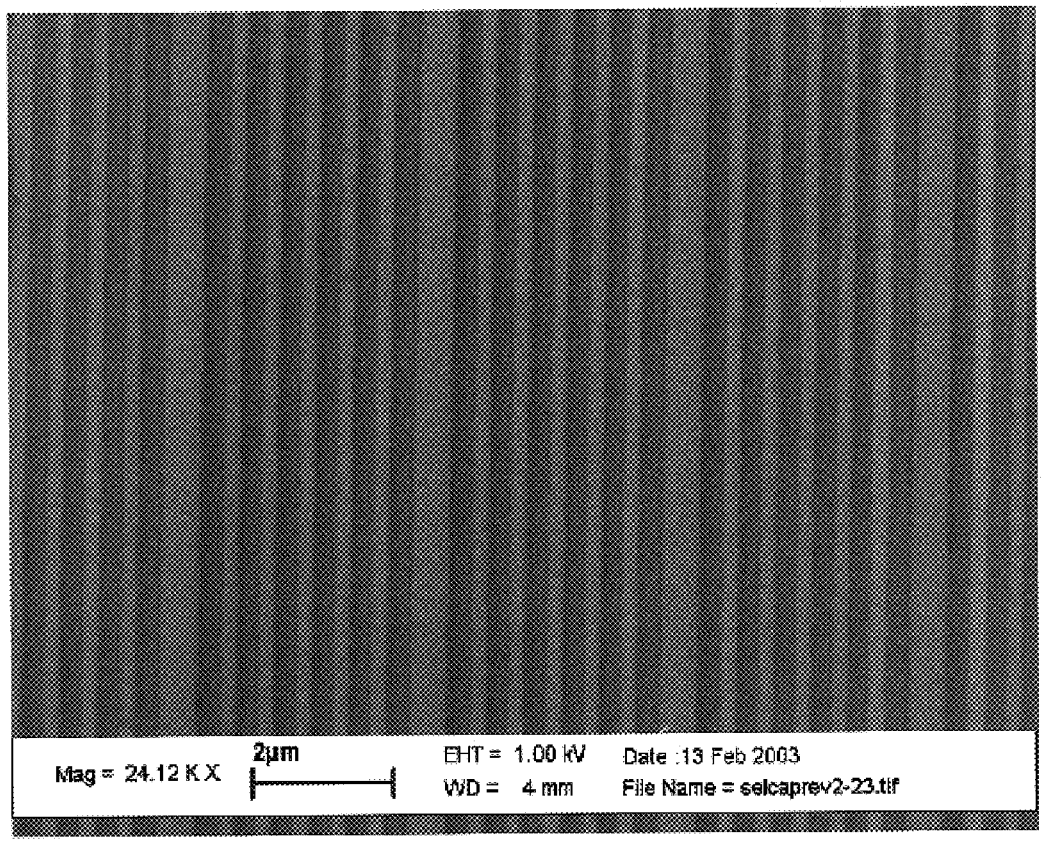
FIG. 5 shows a region of periodic conductive lines and dielectric regions that have been coated, exposed, developed and analyzed by scanning electron microscopy.

FIG. 5 shows a top-down a region of periodic conductive lines and dielectric regions similar to that in FIG. 4 that have been coated with a masking material, exposed and developed.

Figure 6:
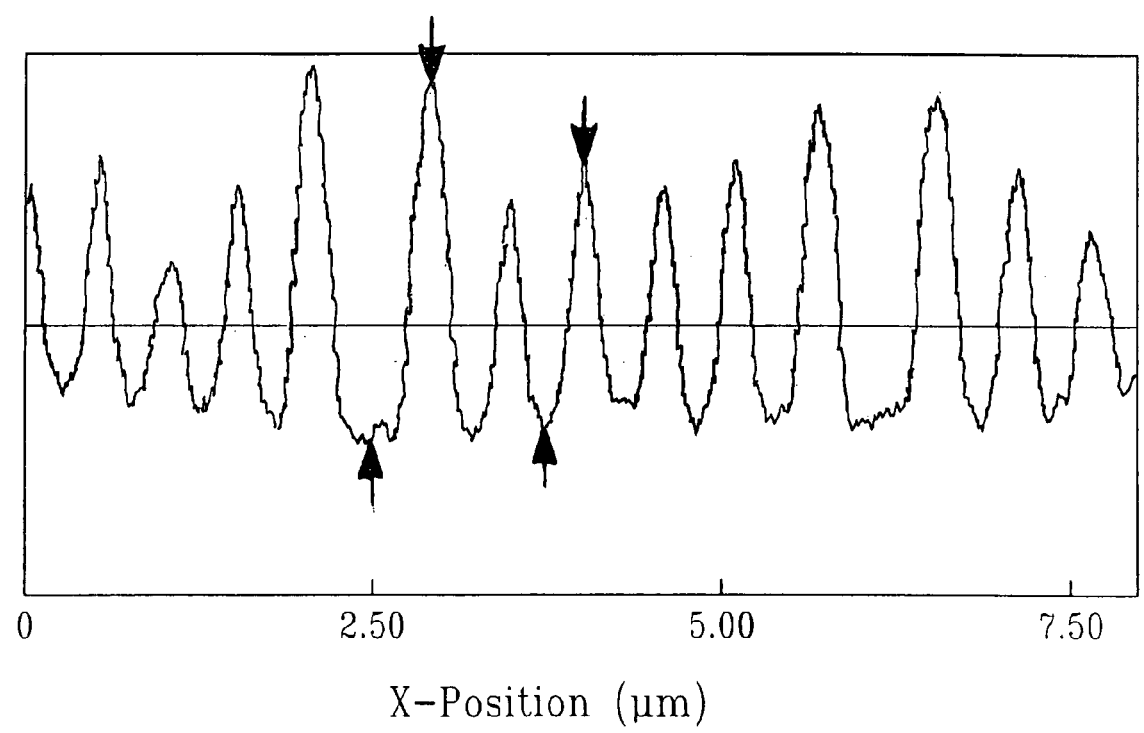
FIG. 6 shows the atomic force microscope line scan of the region in FIG. 5.

FIG. 6 shows the atomic force microscope line scan of the region in FIG. 5. The region had an initial topography that was insignificant compared to that of the topography after exercising the method described in this invention. The topography range was equivalent to the thickness predicted from FIG. 3.

The method of the present invention provides, in one embodiment, a structure comprising a self-aligned pattern on an existing pattern on a substrate. The self-aligned pattern includes a developed masking material that reveals a pattern commensurate with the existing pattern on the substrate. In another embodiment of the present invention, the method of the present invention can provide a structure that comprises a self-aligned pattern on an existing pattern on a substrate, where the self-aligned pattern including a deposited, grown, plated, or sputtered cap material that reveals a pattern commensurate with the existing pattern on the substrate.

Figure 7:
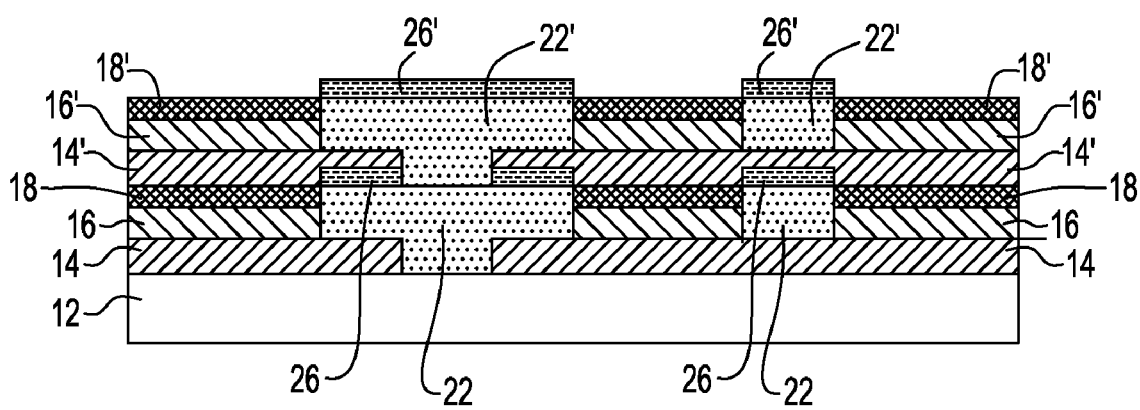
FIG. 7 is a cross-sectional view showing a multilevel interconnect stack of the present invention.

FIG. 7 shows a cross-section view of a multilevel interconnect stack that can be formed utilizing the inventive technology. In the attached drawings, the prime designation has been given to the second level components.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated but fall within the scope of the appended claims.

What is claimed is:

1. A structure comprising:
a first pattern on horizontal surfaces of an existing pattern on a substrate, wherein two or more coplanar regions of distinct optical properties are located on said substrate, said first pattern including an oxide, nitride or oxynitride that reveals a pattern that is self aligned to an outer edge of the existing pattern and is commensurate with the existing pattern on the substrate without any overlay or offset error, and wherein said two or more coplanar regions of distinct optical properties include a second set of regions comprising a developed masking material selected from the group consisting of photoresists and thermally sensitive resists that reveaLs a second pattern that is aligned to an outer edge of a second existing pattern and is commensurate with the second existing pattern in the substrate.

2. The structure of claim 1, wherein said two or more regions of distinctive optical properties include a first set of regions having a first atomic composition and the second set of regions having a second atomic composition different from the first composition.

3. The structure of claim 2, wherein said first set of regions comprises one or more conductive elements and wherein said second set of regions comprises a dielectric.

4. The structure of claim 2, wherein said second pattern is disposed upon said second set of regions.

5. The structure of claim 1, further comprising at least one conductive feature formed on said substrate, with the substrate further comprising at least one insulating layer surrounding said at least one conductive feature.

6. The structure of claim 5, wherein said insulating layer surrounds said at least one conductive feature at its bottom and lateral surfaces.

7. The structure of claim 6, further comprising at least one conductive baffler layer disposed at least at one interface between said insulating layer and said at least one conductive feature.

8. The structure of claim 6, wherein the combination of the at least one conductive feature and the insulating layers is repeated to form a multilevel interconnect stack.

9. The structure of claim 8, further comprising at least one conductive baffler layer disposed on at least one interface between said insulating layer and said at least one conductive feature.

10. A structure comprising:
a substrate comprising two regions of distinct optical properties, wherein the first of said two regions reveals a first existing pattern, and wherein the second of said two regions reveals a second existing pattern that is complementary to the first existing pattern;

a first region located over the substrate, said first region comprising an oxide, nitride or oxynitride that reveals a first pattern that is aligned to an outer edge of the first existing pattern and is commensurate with the first existing pattern in the substrate; and a second region located over the substrate, said second region comprising a developed masking material selected from the group consisting of photoresists and thermally sensitive resists that reveals a second pattern that is aligned to an outer edge of the second existing pattern and is commensurate with the second existing pattern in the substrate, wherein said first and second regions of the layer structure are coplanar.

* * * * *